`US008804364B2`

United States Patent
Li

(10) Patent No.: US 8,804,364 B2
(45) Date of Patent: Aug. 12, 2014

(54) FOOTPRINT ON PCB FOR LEADFRAME-BASED PACKAGES

(75) Inventor: Hao-Jung Li, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 156 days.

(21) Appl. No.: 13/169,009

(22) Filed: Jun. 26, 2011

(65) Prior Publication Data

US 2012/0325540 A1 Dec. 27, 2012

(51) Int. Cl.
*H05K 7/00* (2006.01)
*H05K 1/11* (2006.01)

(52) U.S. Cl.
USPC ........... 361/767; 361/768; 361/777; 174/260; 174/261

(58) Field of Classification Search
USPC ................. 361/760, 767, 768, 772, 777, 783; 174/250, 260, 261
See application file for complete search history.

(56) References Cited

U.S. PATENT DOCUMENTS

| | | | | |
|---|---|---|---|---|
| 6,310,398 B1* | 10/2001 | Katz | ............... | 257/773 |
| 6,388,207 B1* | 5/2002 | Figueroa et al. | ............... | 174/262 |
| 6,597,059 B1* | 7/2003 | McCann et al. | ............... | 257/673 |
| 2005/0082580 A1* | 4/2005 | Hung | ............... | 257/222 |
| 2006/0186538 A1* | 8/2006 | Suzuka | ............... | 257/737 |
| 2007/0148816 A1* | 6/2007 | Davis et al. | ............... | 438/106 |
| 2008/0158839 A1* | 7/2008 | Nishida | ............... | 361/767 |
| 2010/0327324 A1* | 12/2010 | Maede | ............... | 257/203 |
| 2011/0278728 A1* | 11/2011 | Owen et al. | ............... | 257/773 |

* cited by examiner

*Primary Examiner* — Hoa C Nguyen

(74) *Attorney, Agent, or Firm* — Winston Hsu; Scott Margo

(57) ABSTRACT

A footprint of a printed circuit board (PCB) for a leadframe-based package includes a plurality of pads arranged within a central region on a main surface of the PCB; and an array of signal pads disposed within a peripheral region surrounding the central region.

20 Claims, 3 Drawing Sheets

FOOTPRINT ON PCB FOR LEADFRAME-BASED PACKAGES

BACKGROUND OF THE INVENTION

1. Field of the Invention

The present invention relates generally to the field of printed circuit board. More particularly, the present invention relates to a footprint on PCB for leadframe-based packages, which is capable of improving the yield when surface mounting leadframe-based packages to the PCB.

2. Description of the Prior Art

There are various leadframe-based surface mount components, such as quad flat no-lead (QFN) package, advanced QFN (aQFN) package, low-profile quad flat package (LQFP) or the like. A package can be attached to a printed circuit board (PCB) by, for example, soldering it to the PCB. The attachment of the packages (i.e. packaged integrated circuit) to PCBs produces printed circuit board assemblies (PCBAs), which can be used as motherboards in computers, portable devices such as mobile phone, tablets, notebooks, etc.

To solder the package to the PCB, solder paste can be applied to the surface of the PCB at appropriate regions. The solder paste can be applied to the PCB surface by stencil printing method. After the application of solder paste, the package can be positioned on the PCB, and the assembly can be placed into an oven and heated. The heating cause the solder to melt, leading to wetting and wicking. A solder mask can also be applied on the PCB to control the solder paste during heating. The solder mask defines openings on the outer layer of the PCB and exposes the copper circuit pattern such as input/output (I/O) pads, ground pads, power pads, and/or thermal pads of the PCB. The solder mask is placed on the PCB, and solder paste is applied to areas of the PCB to which the package is to be attached that are not protected by a solder mask.

FIG. 1 shows a conventional footprint 100 of a portion of a PCB 110 to which a package, such as a QFN, may be attached. The footprint 100 includes a single, monolithic pad 210 within a central region 101 (indicated by the dotted line) and an array of I/O pads 220 and 222 disposed within a peripheral region 102 surrounding the central region 101. The pad 210 has a surface area that is equal to or slightly larger than a ground pad of the package (not shown). Typically, the contour of the pad 210 is substantially the same as that of the ground pad. Vias 212 are located within the central region 101, which may conduct heat and/or signal between the pad 210 and at least one interior layer of the PCB 110 and the opposite surface of the PCB 110. The ground pad on the bottom side of the package may be soldered to the pad 210 to provide thermal conductivity and a mechanical connection and can also provide an electrical connection. The attachment of the package to the footprint may be carried out by surface mount technology (SMT).

The soldering quality is critical to assembly of packages. To assess soldering quality, visual inspection or automatic optical inspection machine is typically employed. However, the yield of the conventional SMT for attaching leadframe-based packages, such as QFN, aQFN, LQFP or the like, to the footprint as described above is not satisfactory. During visual inspection, defects such as empty solder and cold solder joint are often observed at the inner soldering sites such as solder pads 222 that are located in proximity to the pad 210. It is believed that such defects (empty solder and cold solder joint) are due to the relatively large size of the pad 210 that dissipates heat faster. Therefore, there is a need in this industry to provide a solution to solve the defective soldering problems when attaching a leadframe-based package to PCB.

SUMMARY OF THE INVENTION

It is one objective to provide an improved footprint for leadframe-based packages without the shortcomings of the prior art.

In one aspect, one embodiment of this invention provides a footprint of a printed circuit board (PCB) for a leadframe-based package. The footprint includes a plurality of pads arranged within a central region on a main surface of the PCB; and an array of signal pads disposed within a peripheral region surrounding the central region.

In another aspect, the invention provides a printed circuit board assembly (PCBA) comprising a footprint of a printed circuit board (PCB). The footprint includes a plurality of pads arranged within a central region on a main surface of the PCB, and an array of signal pads disposed within a peripheral region surrounding the central region; and a leadframe-based package mounted on the footprint.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
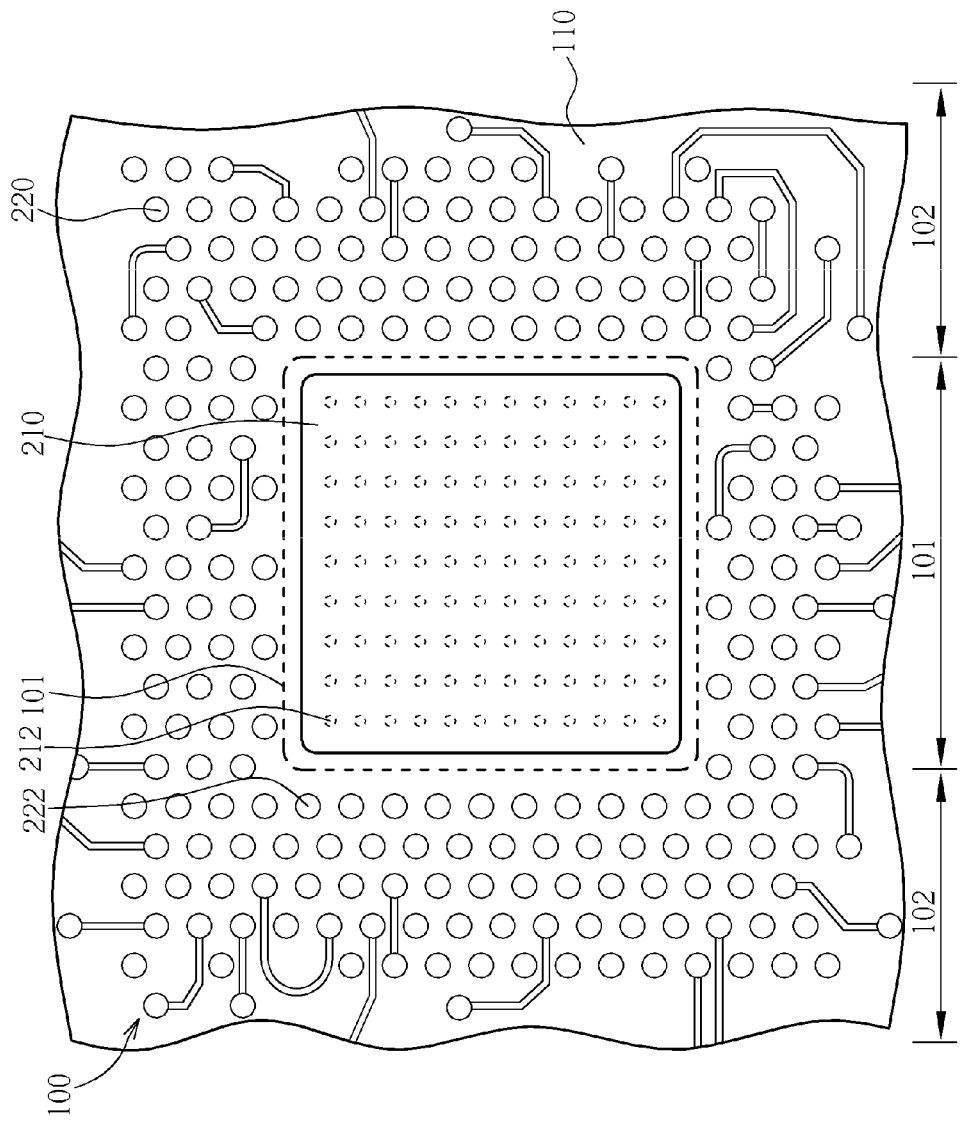
FIG. 1 shows a footprint of a portion of a conventional PCB to which a package may be attached.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 2:
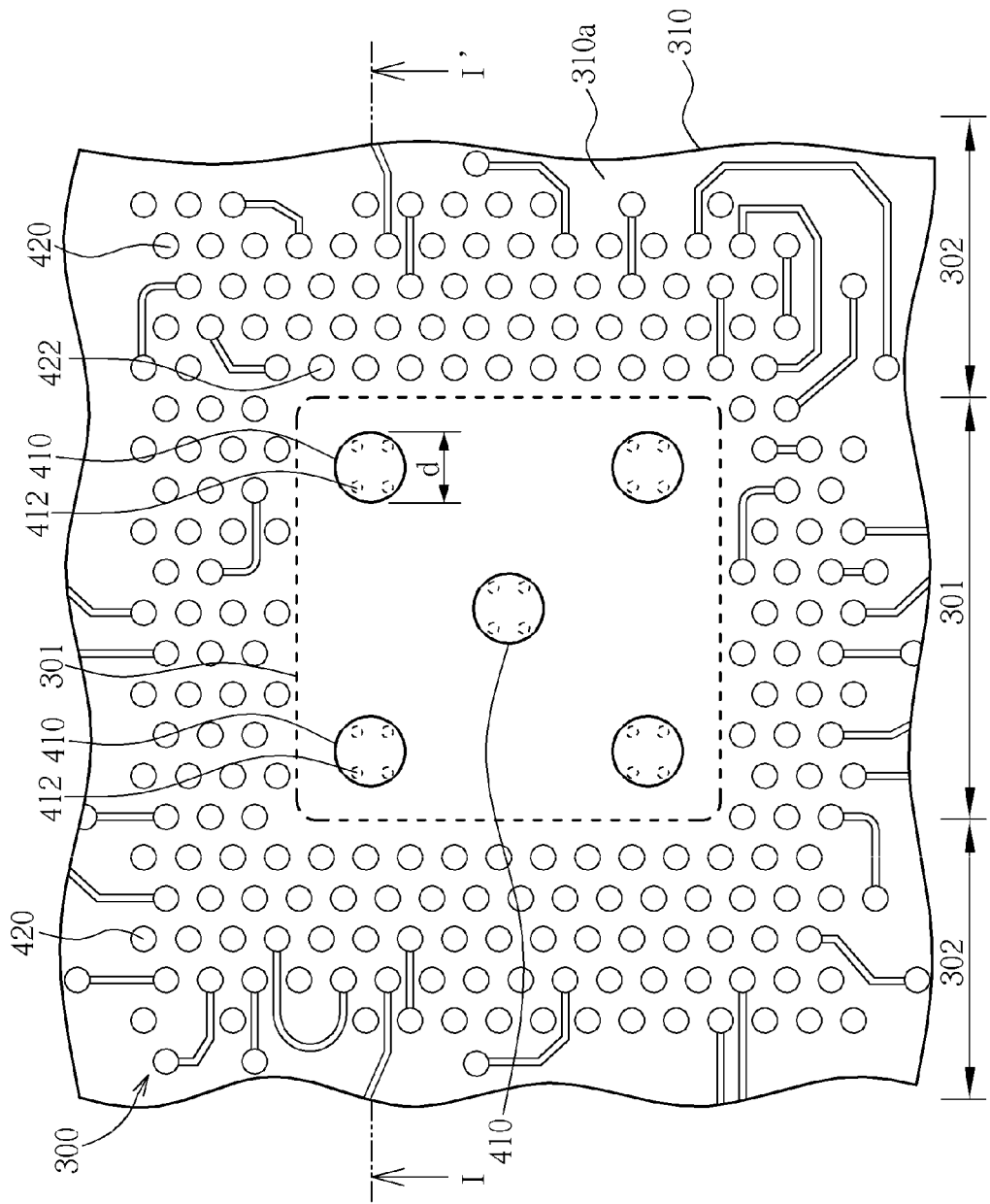
FIG. 2 shows an exemplary footprint of a portion of a PCB to which a leadframe-based package may be attached according to one embodiment of this invention.

FIG. 2 shows an exemplary footprint 300 of a portion of a PCB 310 to which a package, such as a QFN, a low-profile quad flat package (LQFP), an advanced QFN (aQFN) or any other leadframe-based package, may be attached according to one embodiment of this invention. As shown in FIG. 2, according to the exemplary embodiment of this invention, the footprint 300 includes a plurality of pads 410, such as thermal pads, ground pads, power pads and/or signal pads, arranged within a central region 301 (indicated by the dotted line) on the main surface 310a of the PCB 310. According to this embodiment of this invention, the pads 410 may have similar dimensions or have substantially the same surface area. According to the exemplary embodiment of this invention, preferably, the pads 410 are evenly distributed within the central region 301. The foot print can also include an array of I/O pads and/or signal pads 420 and 422 disposed within a peripheral region 302 surrounding the central region 301. In this exemplary embodiment, five pads 410 are arranged in the central region 301. However, it is understood that the number of the pads 410 may vary in different cases depending upon the design requirements.

According to the exemplary embodiment of this invention, the central region 301 can correspond to a ground pad of the package, such as QFN, LQFP, aQFN or any other leadframe-based package, to be attached to the PCB 310. More specifically, the central region 301 may have an outline or contour that is substantially the same as that of the ground pad of the package, such as QFN, LQFP, aQFN or any other leadframe-based package, to be attached to the PCB 310. According to the exemplary embodiment of this invention, the plurality of pads 410 can be evenly and/or sparsely arranged within the central region 301. In one embodiment, the plurality of pads 410 can be distributed to form a symmetric pattern when viewed from above in order to evenly support the weight of the package, such as QFN, LQFP, aQFN or any other leadframe-based package, to be attached to the PCB 310. In this regard, it is preferred that each of the four corners of the central region 301 has at least one pad 410.

According to the exemplary embodiment of this invention, the total surface area of the pads 410 may be less than a threshold, such as 50% of the surface area of the central region 301. In one embodiment, the total surface area of the pads 410 may be less than 30% of the surface area of the central region 301. The shape of each of the pads 410 may include but not limited to circular shape, rectangular shape, polygonal shape or irregular shape. Besides, for example, each of the pads 410 may have a dimension (or diameter) d ranging between 4 mil and 400 mil. The dimension d of each of the pads 410 within the central region 301 may be not smaller than the dimension of each of the signal pads 420 and 422 within the peripheral region 302. Further, it is to be understood that in this embodiment at least one of the pads 410 may have different dimension from another of the pads 410 within the central region 301. For example, the central pad 410 disposed at the center of the central region 301 may be larger than the corner pads 410 disposed at the four corners of the central region 301.

At least one via 412 is disposed within the central region 301 and is situated under, such as directly under, at least one of the pads 410. The via 412 can be a plated through hole (PTH), which may couple the pad 410 to at least one interior layer of the PCB 310 and/or to the opposite surface of the PCB 310. The via 412 can conduct heat and/or transmit signal between the pad 410, at least one interior layer of the PCB 310 and/or the opposite surface of the PCB 310. However, it is to be understood that in some cases the via 412 may be spared or omitted under at least one pad 410. Since the plurality of the pads 410 occupy smaller area than the surface area of the central region 301, the heat dissipated by the pads 410 during reflow of the solder can be reduced, whereby the defects such as empty solder and cold solder joint that typically occur at the inner solder pads located in proximity to the pad 410 are effectively decreased. Further, it is advantageous to use this invention because the rest of the surface area of the central region 301 can be spared for routing the circuit traces (not shown) on the PCB 310.

Figure 3:
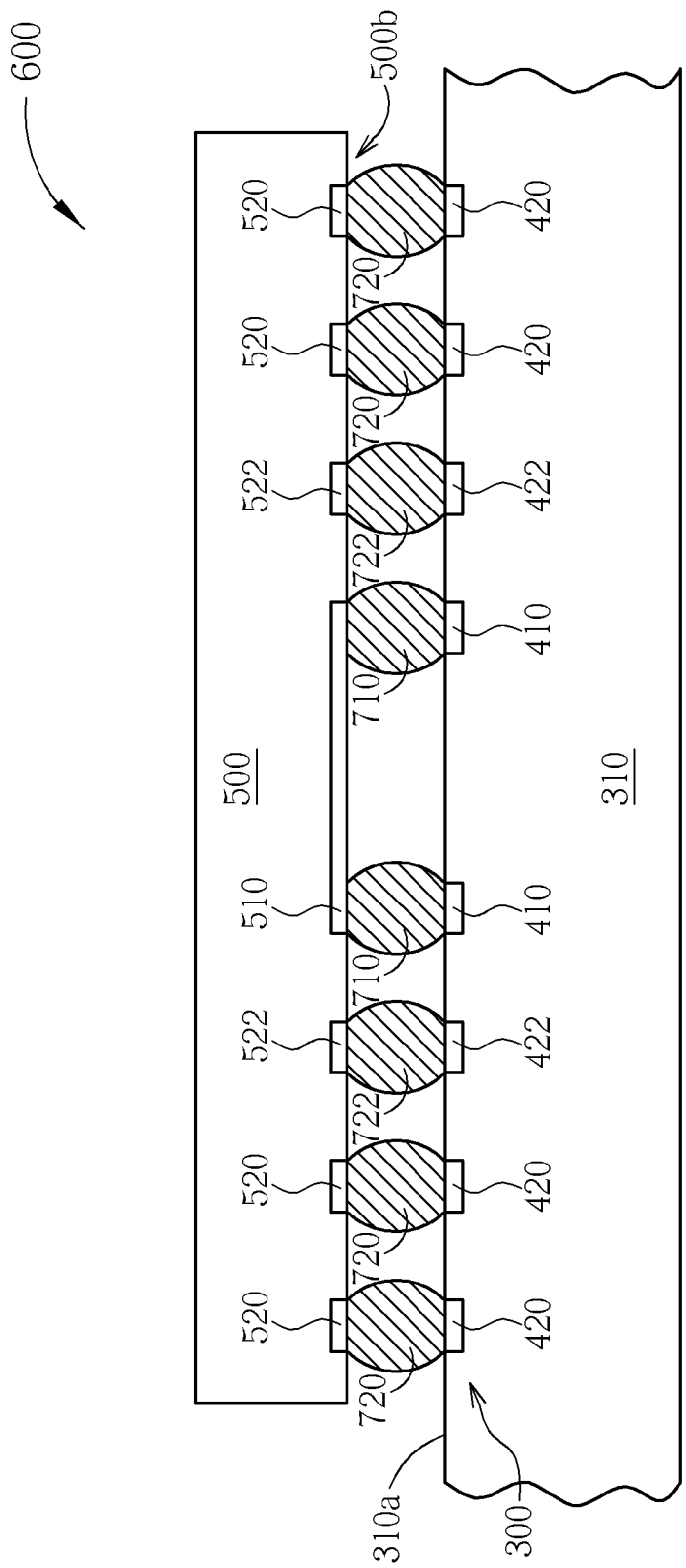
FIG. 3 is a schematic, cross-sectional diagram showing a printed circuit board assembly (PCBA) including a leadframe-based package attached to the footprint on the PCB in accordance with another embodiment of this invention.

FIG. 3 is a schematic, cross-sectional diagram, taken along line I-I' in FIG. 2, showing a printed circuit board assembly (PCBA) 600 including a leadframe-based package 500 mounted, such as soldered, on the footprint 300 of the PCB 310 according to this invention. As shown in FIG. 3, and FIG. 2 briefly, the PCBA 600 includes a leadframe-based package 500 including but not limited to QFN, aQFN and LQFP, which is mounted on a footprint 300 of the PCB 310. An exemplary layout of the footprint 300 is illustrated in FIG. 2. The leadframe-based package 500 can include a central ground pad 510 and a plurality of I/O pads 520 and 522 on its bottom side 500b. The surface of the central ground pad 510 and the surface of the each of the plurality of I/O pads 520 and 522 may be protected by a solderable conductive film (not shown), which may contain nickel and/or gold, for example. The central ground pad 510 may correspond to the central region 301 and the pads 410 within the central region 301, and the plurality of I/O pads 520 and 522 may correspond to the plurality of signal pads 420 and 422 within the peripheral region 302. When the leadframe-based package 500 is attached to the footprint 300 of the PCB 310, the central ground pad 510 can be electrically coupled to the pads 410 via solder balls 710, and the plurality of I/O pads 520 and 522 can be electrically coupled to respective signal pads 420 and 422 via the solder balls 720 and 722.

To mount the leadframe-based package 500 on the PCB 310, solder paste can be applied to the surface of the pads 410 and the signal pads 420 and 422. The solder paste can be applied to the PCB surface by stencil printing method. After the application of solder paste, the leadframe-based package 500 can be positioned on the PCB, and the assembly can be placed into an oven and heated (also known as "reflow" process). The heating causes the solder to melt, leading to wetting and wicking. A solder mask (not explicitly shown) can also be applied on the PCB 310 to control the solder paste during heating. The solder mask defines openings on the outer layer of the PCB and exposes the pads 410 and the signal pads 420 and 422. The solder mask is placed on the PCB, and solder paste is applied to areas of the PCB to which the leadframe-based package 500 is to be attached that are not protected by a solder mask.

Those skilled in the art will readily observe that numerous modifications and alterations of the device and method may be made while retaining the teachings of the invention.

What is claimed is:

1. A footprint of a printed circuit board (PCB) for a leadframe-based package, the PCB having a main surface, the footprint comprising:
   a plurality of pads arranged within a central region on the main surface of the PCB; and
   an array of signal pads disposed within a peripheral region surrounding the central region, wherein a surface area of each of the plurality of pads arranged within the central region is bigger than a surface area of each of the array of signal pads disposed within the peripheral region, wherein a total surface area of the plurality of pads arranged within the central region is less than 50% of the surface area of the central region.

2. The footprint according to claim 1 wherein the central region corresponds to a ground pad located on a bottom side of the leadframe-based package.

3. The footprint according to claim 2 wherein the central region has a contour that is substantially the same as that of the ground pad of the leadframe-based package to be attached to the PCB.

4. The footprint according to claim 1 wherein the plurality of pads are evenly arranged within the central region.

5. The footprint according to claim 1 wherein the plurality of pads are distributed to form a symmetric pattern when viewed from above in order to evenly support weight of the leadframe-based package to be attached to the PCB.

6. The footprint according to claim 1 wherein a dimension of each of the pads within the central region is not smaller than a dimension of each of the signal pads.

7. The footprint according to claim 1 wherein at least one via is disposed within the central region and is situated under at least one of the pads.

8. The footprint according to claim 7 wherein the via is a plated through hole (PTH), which couples the pad to at least one interior layer of the PCB.

9. The footprint according to claim 1 wherein at least one of the pads has different dimension from another of the pads within the central region.

10. The footprint according to claim 1 wherein the plurality of pads comprises at least a central pad disposed at the center of the central region and corner pads disposed at four corners of the central region.

11. The footprint according to claim 10 wherein the central pad is larger than each of the corner pads.

12. The footprint according to claim 1 wherein the leadframe-based package is a quad flat no-lead (QFN) package, a low-profile quad flat package (LQFP) or a combination thereof.

13. The footprint according to claim 1 wherein the leadframe-based package is an advanced QFN (aQFN) package.

14. A printed circuit board assembly (PCBA), comprising:
a footprint of a printed circuit board (PCB), comprising a plurality of pads arranged within a central region on a main surface of the PCB, and an array of signal pads disposed within a peripheral region surrounding the central region; and
a leadframe-based package mounted on the footprint, wherein a surface area of each of the plurality of pads arranged within the central region is bigger than a surface area of each of the array of signal pads disposed within the peripheral region, wherein a total surface area of the plurality of pads arranged within the central region is less than 50% of the surface area of the central region.

15. The PCBA according to claim 14 wherein the leadframe-based package is a QFN package, a LQFP or a combination thereof.

16. The PCBA according to claim 14 wherein the leadframe-based package is an advanced QFN (aQFN) package.

17. The PCBA according to claim 14 wherein the central region corresponds to a ground pad located on a bottom side of the leadframe-based package.

18. The PCBA according to claim 17 wherein the central region has a contour that is substantially the same as that of the ground pad of the leadframe-based package.

19. The PCBA according to claim 14 wherein a dimension of each of the pads within the central region is not smaller than a dimension of each of the signal pads.

20. The PCBA according to claim 14 wherein the plurality of pads are evenly arranged within the central region.

* * * * *